(12) United States Patent
Chen et al.

(10) Patent No.: US 7,683,309 B1
(45) Date of Patent: Mar. 23, 2010

(54) PHOTOSENSOR AND METHOD FOR FABRICATING THE SAME

(75) Inventors: Shin-Shueh Chen, Hsin-Chu (TW); Wan-Yi Liu, Hsin-Chu (TW); Chia-Tien Peng, Hsin-Chu (TW); Tsung-Yi Hsu, Hsin-Chu (TW); Jen-Pei Tseng, Hsin-Chu (TW)

(73) Assignee: AU Optronics Corporation, Hsin-Chu (TW)

( * ) Notice: Subject to any disclaimer, the term of this patent is extended or adjusted under 35 U.S.C. 154(b) by 20 days.

(21) Appl. No.: 12/348,087

(22) Filed: Jan. 2, 2009

(30) Foreign Application Priority Data

Oct. 30, 2008 (TW) .............................. 97141828 A (51) Int. Cl.
*G01J 1/44* (2006.01)
*H05B 37/02* (2006.01)

(52) U.S. Cl. .......................... 250/214 AL; 250/214.1; 250/214 R; 257/290

(58) Field of Classification Search .............. 250/214.1, 250/214 R, 214 AL; 257/290–294
See application file for complete search history.

(56) References Cited

U.S. PATENT DOCUMENTS 5,663,576 A    9/1997  Shimizu

| 6,489,213 | B1 * | 12/2002 | Hsueh et al. ......... 257/E27.101 |
| 6,596,653 | B2 | 7/2003 | Tan et al. |
| 2006/0180816 | A1 | 8/2006 | Li et al. |
| 2006/0237809 | A1 | 10/2006 | Bhattacharyya |
| 2007/0186970 | A1 | 8/2007 | Takahasi et al. |

FOREIGN PATENT DOCUMENTS

TW          445543       7/2001
TW       200832516       8/2008

OTHER PUBLICATIONS

English language translation of abstract of 445543.
English language translation of abstract of 200832516.

* cited by examiner

*Primary Examiner*—Seung C Sohn
(74) *Attorney, Agent, or Firm*—Thomas, Kayden, Horstemeyer & Risley (57) ABSTRACT

A photosensor includes a metal conductive layer, an interface dielectric layer, a silicon-rich dielectric layer and a transparent conductive layer. The interface dielectric layer is formed on the metal conductive layer. The silicon-rich dielectric layer is formed on the interface dielectric layer. The transparent conductive layer is formed on the silicon-rich dielectric layer. A method for fabricating a photosensor is also disclosed herein.

30 Claims, 8 Drawing Sheets

PHOTOSENSOR AND METHOD FOR FABRICATING THE SAME

RELATED APPLICATIONS

This application claims priority to Taiwan Patent Application Serial Number 97141828, filed Oct. 30, 2008, which is herein incorporated by reference.

BACKGROUND

1. Field of Invention

The present invention relates to a photosensor. More particularly, the present invention relates to an ambient light sensor (ALS).

2. Description of Related Art

For fabricating an ambient light sensor (ALS) on a TFT-LCD panel in prior art, since the amorphous silicon (α-Si) or poly silicon (poly-Si) film has stronger sensitivity to the light with wave band between visible light (400 nm-700 nm) and near infrared (700 nm-1.1 μm), α-Si or poly-Si is usually used as the fundamental material when fabricating ALS. Nevertheless, the sensitivity of α-Si or poly-Si cannot satisfy the strict requirements nowadays, so they are gradually replaced by other novel material.

Photosensor of new generation has higher sensitivity. Take for example the photosensor having a silicon-rich oxide layer ($SiO_X$, X<2) as a photo sense layer. When a light source illuminates the photosensor, the silicon-rich oxide layer is excited to produce electron-hole pairs and the electron-hole pairs are immediately separated by a electric field caused by a bias voltage. Then, the photo current is thus generated and output.

However, when the silicon-rich oxide layer is formed by using the low temperature deposition thin film process and the photosensor having the silicon-rich oxide layer is accordingly fabricated, if the light having a specific illumination illuminates the photosensor and the corresponding photo current is then measured, the photo current outputted from the photosensor usually fails to have a linear relationship with the light illumination. Accordingly, there could be huge errors when using the photosensor such that the photosensor cannot precisely operate.

SUMMARY

In accordance with one embodiment of the present invention, a photosensor is provided. The photosensor comprises a metal conductive layer, an interface dielectric layer, a silicon-rich dielectric layer and a transparent conductive layer. The interface dielectric layer is formed on the metal conductive layer. The silicon-rich dielectric layer is formed on the interface dielectric layer. The transparent conductive layer is formed on the silicon-rich dielectric layer.

In accordance with another embodiment of the present invention, a photosensor is provided. The photosensor comprises a titanium/aluminum/titanium layer, an interface oxide layer, a silicon-rich dielectric layer and a transparent conductive layer. The interface oxide layer is formed on the titanium/aluminum/titanium layer. The silicon-rich dielectric layer is formed on the interface oxide layer. The transparent conductive layer is formed on the silicon-rich dielectric layer.

In accordance with yet another embodiment of the present invention, a photosensor is provided. The photosensor comprises a conductive layer, an interface dielectric layer, a silicon-rich dielectric layer and a transparent conductive layer. The interface dielectric layer is formed on the conductive layer. The silicon-rich dielectric layer is formed on the interface dielectric layer. The transparent conductive layer is formed on the silicon-rich dielectric layer.

In accordance with still another embodiment of the present invention, a method for fabricating a photosensor is provided. The method comprises the steps of: forming a metal conductive layer; forming an interface dielectric layer on the metal conductive layer; forming a silicon-rich dielectric layer on the interface dielectric layer; and forming a transparent conductive layer on the silicon-rich dielectric layer.

In accordance with still yet another embodiment of the present invention, a method for fabricating a photosensor is provided. The method comprises the steps of: forming a titanium/aluminum/titanium layer; forming an interface oxide layer on the titanium/aluminum/titanium layer; forming a silicon-rich dielectric layer on the interface oxide layer; and forming a transparent conductive layer on the silicon-rich dielectric layer.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference to the accompanying drawings as follows.

DESCRIPTION OF THE PREFERRED EMBODIMENTS

In the following detailed description, the embodiments of the present invention have been shown and described. As will be realized, the invention is capable of modification in various respects, all without departing from the invention. Accordingly, the drawings and description are to be regarded as illustrative in nature, and not restrictive.

Figure 1:
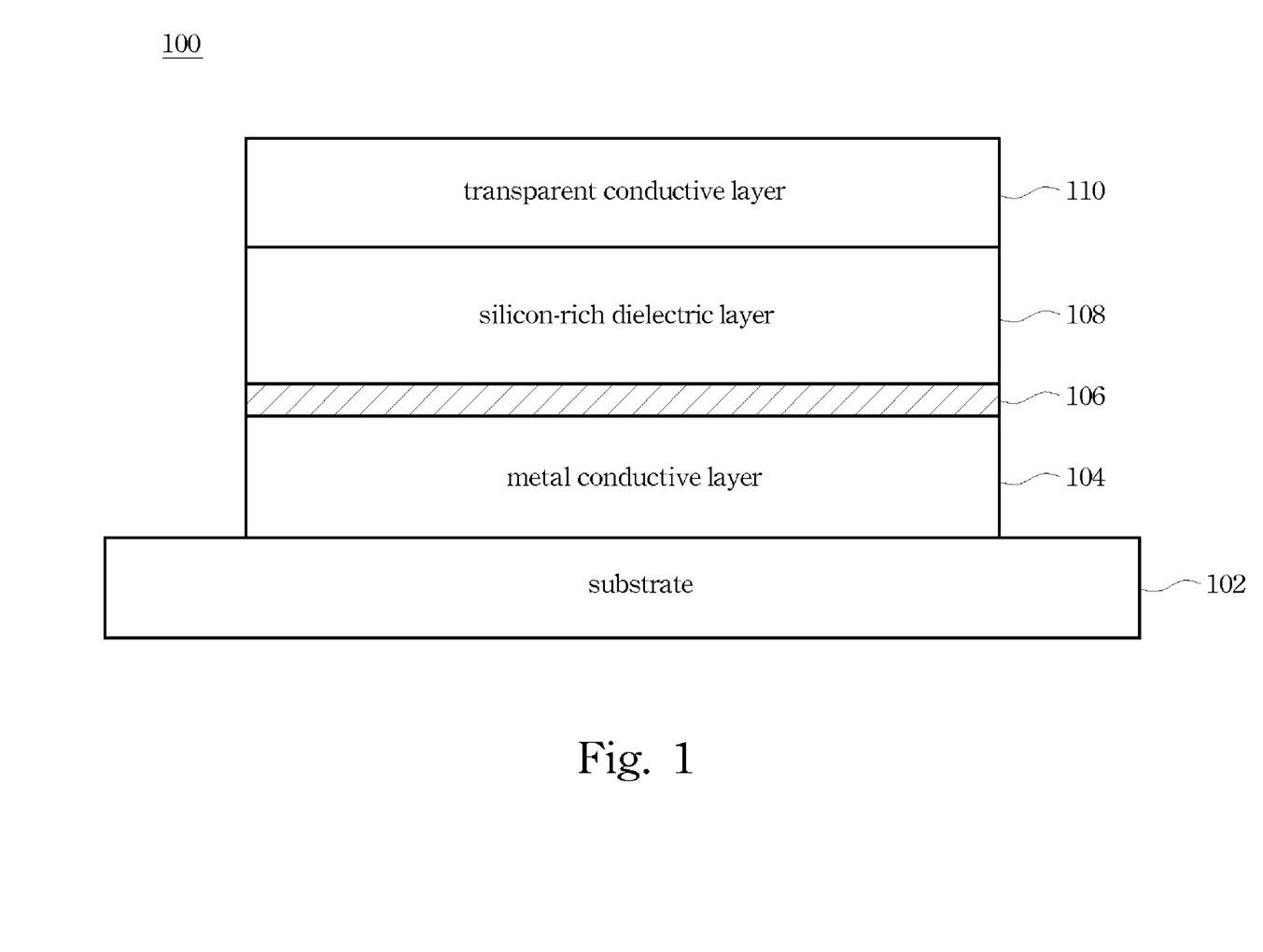
FIG. 1 illustrates a diagram showing a cross section of a photosensor according to one embodiment of the present invention.

FIG. 1 illustrates a diagram showing a cross section of a photosensor according to one embodiment of the present invention. As shown in FIG. 1, the locally magnified part of the photosensor 100 (e.g. ambient light sensor, ALS) includes a substrate 102, a metal conductive layer (or conductive layer) 104, an interface dielectric layer 106, a silicon-rich dielectric layer 108 and a transparent conductive layer 110, in which the metal conductive layer 104 is formed on the substrate 102, the interface dielectric layer 106 is formed on the metal conductive layer 104, the silicon-rich dielectric layer 108 is formed on the interface dielectric layer 106, and the transparent conductive layer 110 is formed on the silicon-rich dielectric layer 108. The metal conductive layer 104, the interface dielectric layer 106, the silicon-rich dielectric layer 108 and the transparent conductive layer 110 in the photosensor 100 can be designed to have its own required shape in practice. The metal conductive layer 104 and the transparent conductive layer 110 are electrically connected to external circuits, such that when the light illuminates and transmits through the transparent conductive layer 110 to the silicon-rich dielectric layer 108, the photo current is generated and outputted to the external circuits. In another embodiment, the metal conductive layer 104 also can be replaced with another transparent conductive layer.

Figure 2A:
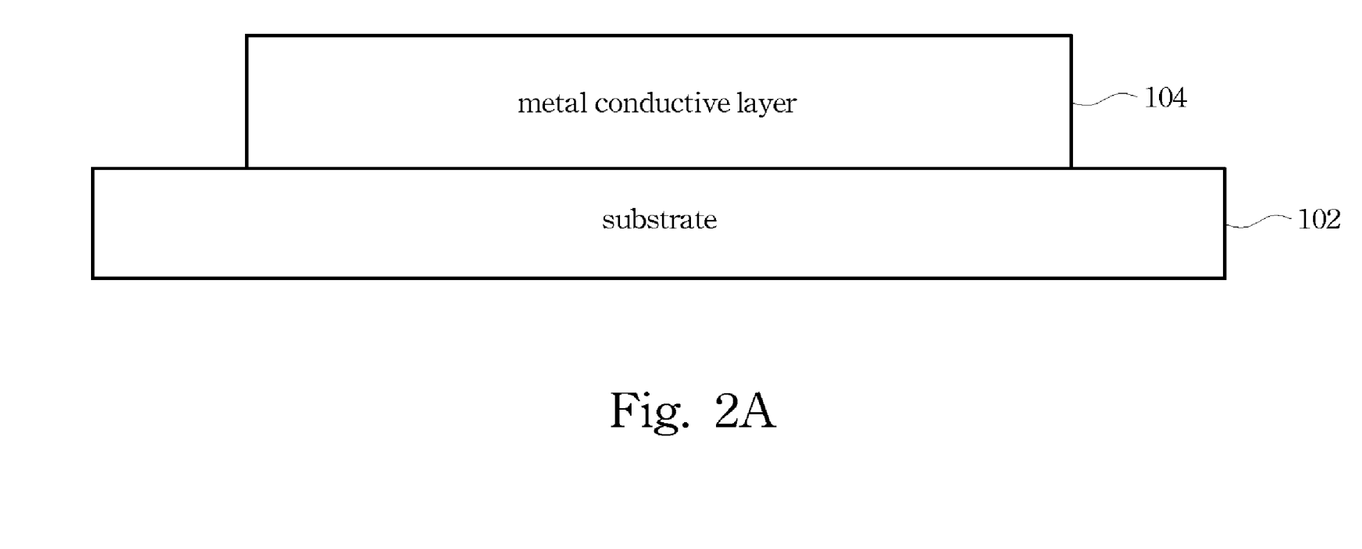
FIGS. 2A to 2E illustrate a flow chart of fabricating the photosensor as shown in FIG. 1 according to one embodiment of the present invention.
Figure 2B:
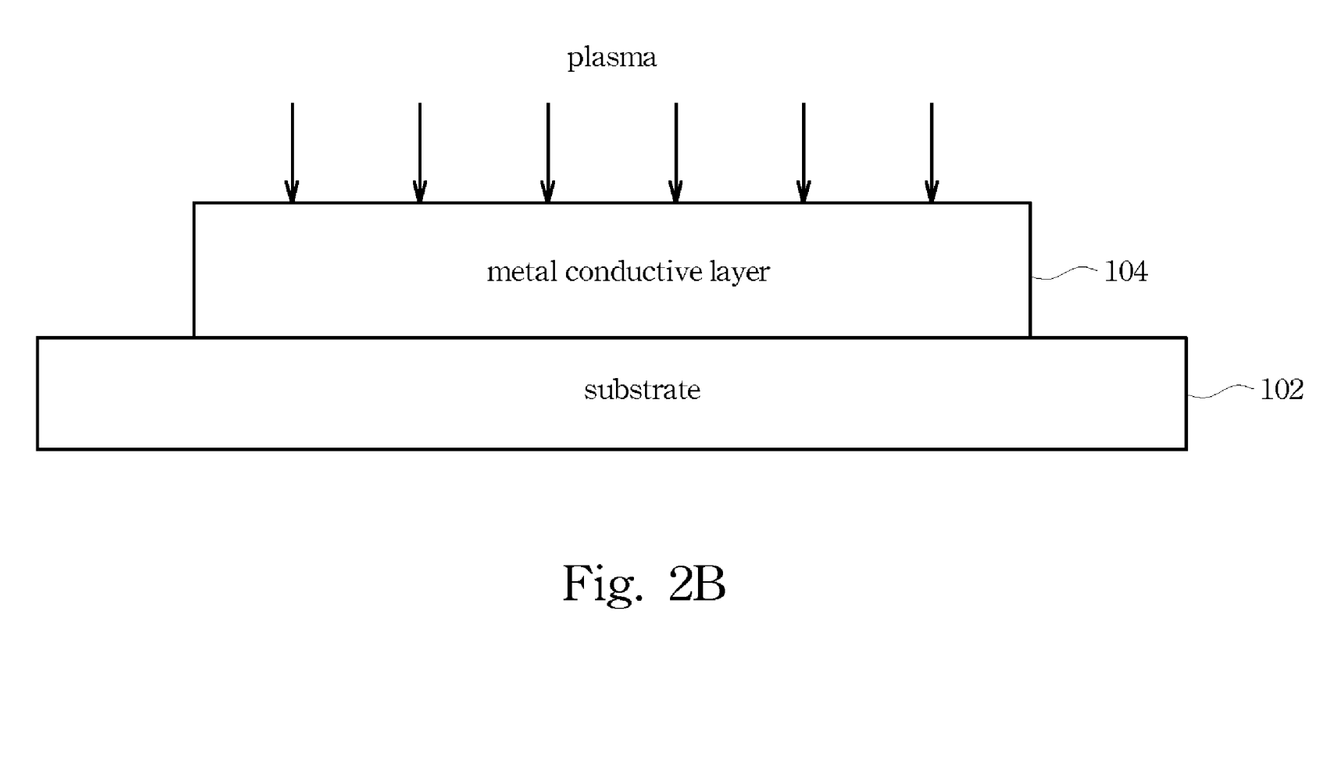
Figure 2C:
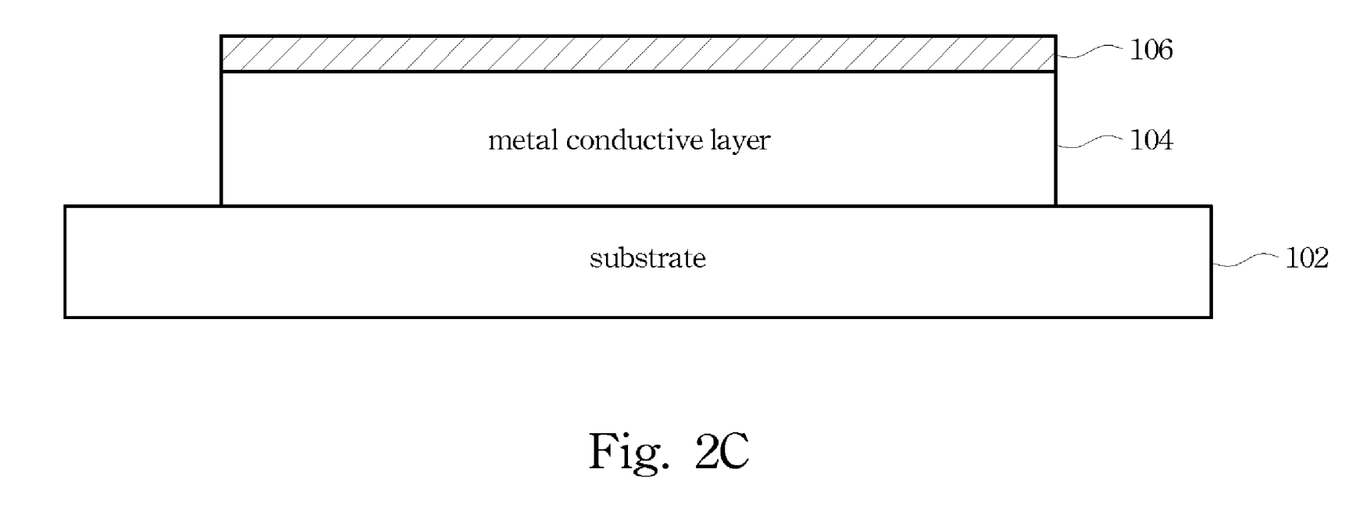

FIGS. 2A to 2E illustrate a flow chart of fabricating the photosensor as shown in FIG. 1 according to one embodiment of the present invention. First, the metal conductive layer 104 is formed on the substrate 102 (as shown in FIG. 2A), in which the metal conductive layer 104 can include a titanium/aluminum/titanium (Ti/Al/Ti) layer. Then, the interface dielectric layer 106 is formed on the metal conductive layer 104, in which the material of the interface dielectric layer 106 can be selected from the group consisting of oxide, nitride, oxynitride and the combination thereof. The interface dielectric layer 106 has a thickness of approximately 10 angstroms (Å) to approximately 300 angstroms (Å). In another embodiment, the interface dielectric layer 106 has a preferable thickness of approximately 20 Å to approximately 200 Å. In yet another embodiment, the interface dielectric layer 106 has a preferable thickness of approximately 30 Å to approximately 150 Å. The interface dielectric layer 106 can be formed by employing different processes. For example, a plasma surface treatment using a plasma gas is performed to the metal conductive layer 104 (as shown in FIG. 2B), such that ions or electrons in the plasma bombard the surface of the metal conductive layer 104, and the molecular bonds of the surface of the metal conductive layer 104 are thus broken and reformed with free radicals in the plasma, due to energy transformation, so as to form the interface dielectric layer 106 (as shown in FIG. 2C). For instance, the surface of the metal conductive layer 104 is a titanium (Ti) thin film. When using oxygen plasma to perform a plasma surface treatment to the Ti thin film, oxygen ions in the oxygen plasma bombard the surface of the Ti thin film, and the molecular bonds of the surface of the Ti thin is film are thus broken and reformed with the oxygen ions in the oxygen plasma, due to energy transformation, so as to form a titanium oxide layer including titanium to be the interface dielectric layer.

Furthermore, the foregoing plasma gas also can be selected from the group consisting of oxygen, nitrogen, nitrous oxide and the combination thereof, and the correspondingly formed interface dielectric layer 106 can be selected from the group consisting of oxide, nitride, oxynitride and the combination thereof. In one embodiment, the surface of the metal conductive layer 104 is a Ti thin film, and the interface dielectric layer 106 is selected from the group consisting of titanium oxide, titanium nitride, titanium oxynitride and the combination thereof.

Figure 2D:
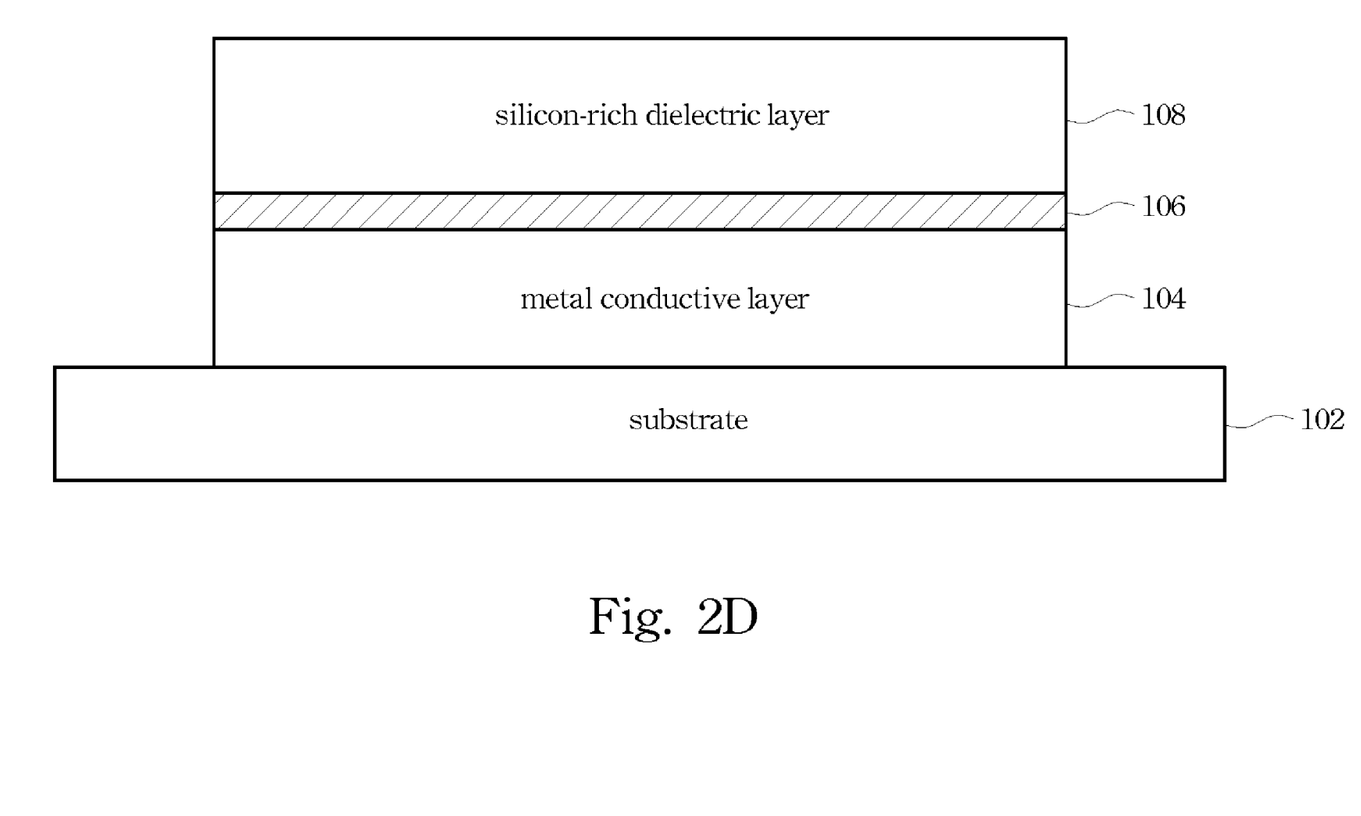
Figure 2E:
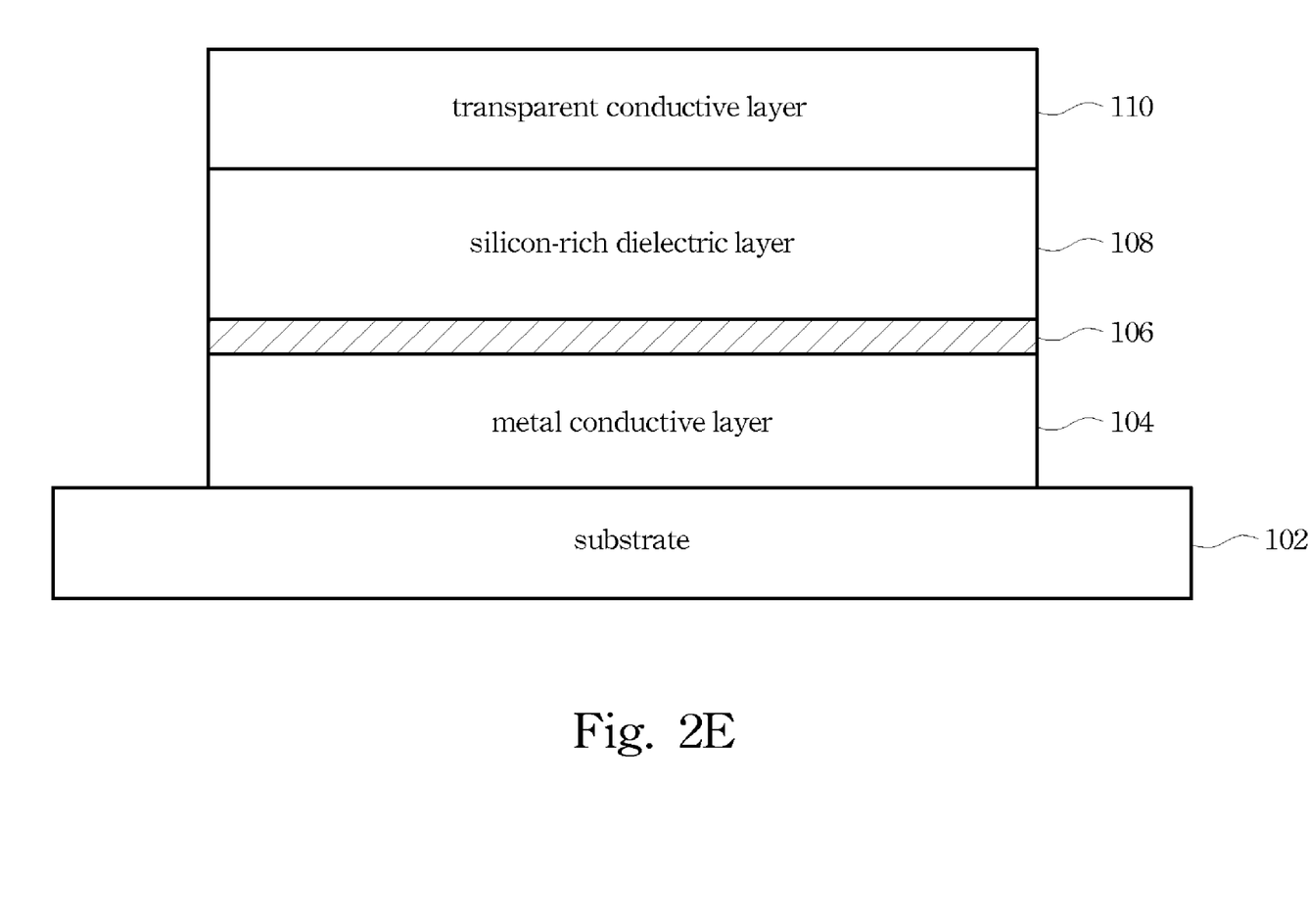

After the interface dielectric layer 106 is formed, the silicon-rich dielectric layer 108 is formed on the interface dielectric layer 106 (as shown in FIG. 2D) to be a photo sense layer. The stoichiometry of silicon of the silicon-rich dielectric layer 108 is larger than 1, and the material of the silicon-rich dielectric layer 108 can be selected from the group consisting of silicon-rich silicon oxide ($SiO_x$), silicon-rich silicon nitride ($SiN_y$), silicon-rich silicon oxynitride ($SiO_xN_y$), silicon-rich silicon carbide ($SiC_w$), silicon-rich silicon oxycarbide ($SiC_wO_x$) and the combination thereof, where $0.01<w<1$, $0.01<x<2$, $0.01<y<1.67$. In another embodiment, the silicon-rich dielectric layer 108 can further be replaced to with a hydrogenated silicon-rich dielectric layer; that is, hydrogen can be used when forming the silicon-rich dielectric layer 108 so as to form the hydrogenated silicon-rich dielectric layer, in which the material of the hydrogenated silicon-rich dielectric layer can be selected from the group consisting of hydrogenated silicon-rich silicon oxide ($SiO_xH_z$), hydrogenated silicon-rich silicon nitride ($SiN_yH_z$), hydrogenated silicon-rich silicon oxynitride ($SiO_xN_yH_z$), hydrogenated silicon-rich silicon oxycarbide ($SiC_wO_xH_z$) and the combination thereof, where $0.01<w<1$, $0.01<x<2$, $0.01<y<1.67$, $0.01<z<1$. Afterwards, the transparent conductive layer 110 is formed on the silicon-rich dielectric layer 108 (as shown in FIG. 2E), in which the material of the transparent conductive layer 110 can be, for example, indium tin oxide, indium zinc oxide or aluminum zinc oxide.

Figure 3:
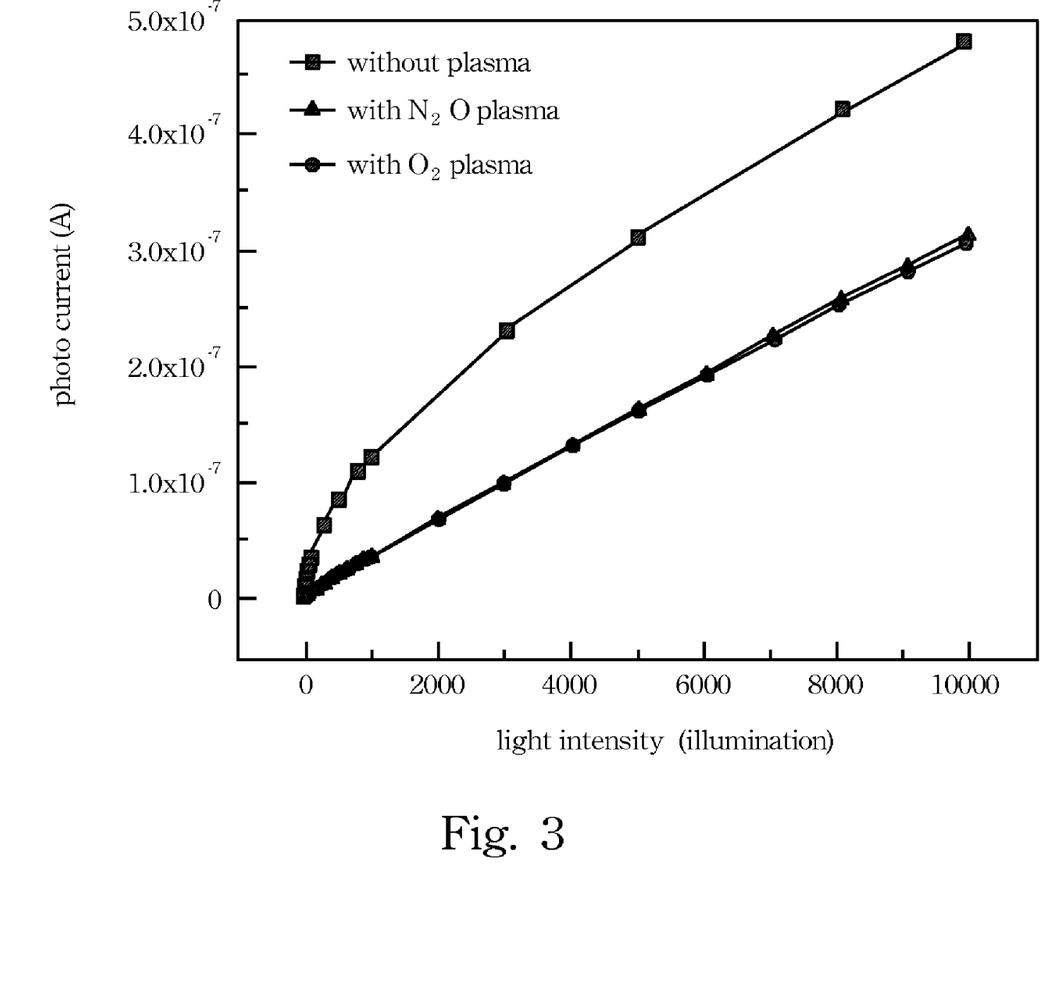
FIG. 3 illustrates a diagram showing the photo current corresponding to the photo intensity after measurements of an ambient light sensor having the foregoing interface dielectric layer.

FIG. 3 illustrates a diagram showing the photo current corresponding to the photo intensity after measurements of an ambient light sensor having the foregoing interface dielectric layer. As shown in FIG. 3, for the ambient light sensor without plasma surface treatment, the photo current fails to have a linear relationship with the photo intensity due to the metal conductive layer and the silicon-rich dielectric layer having no interface dielectric layer therebetween; instead, they have a parabolic relationship. On the contrary, for the ambient light sensor with nitrous oxide ($N_2O$) or oxygen ($O_2$) plasma surface treatment, the photo current has a linear relationship with the photo intensity due to the metal conductive layer and the silicon-rich dielectric layer having the foregoing interface dielectric layer therebetween.

Figure 4:
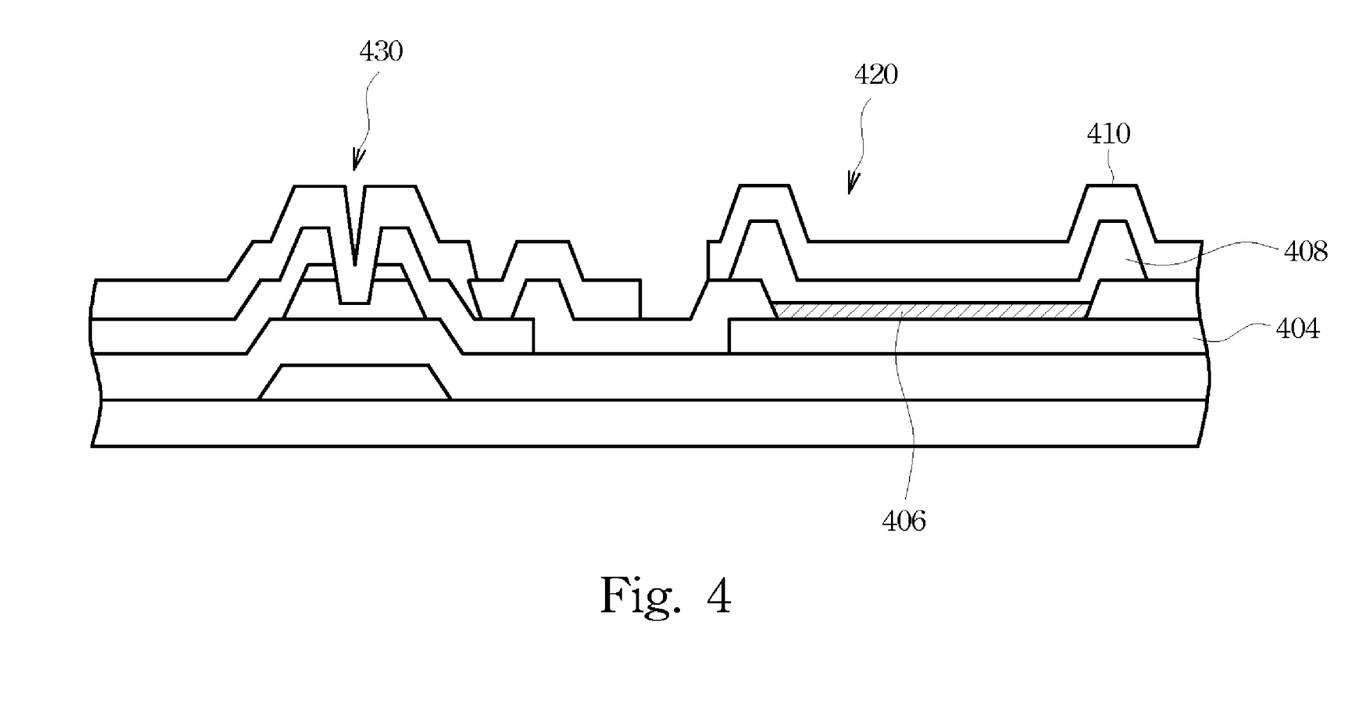
FIG. 4 illustrates a cross section of integrated structure of a pixel and an ambient light sensor according to one embodiment of the present invention.

FIG. 4 illustrates a cross section of integrated structure of a pixel and an ambient light sensor according to one embodiment of the present invention. As shown in FIG. 4, the photosensor 420 includes the metal conductive layer 402, the interface dielectric layer 406, the silicon-rich dielectric layer 408 and the transparent conductive layer 410 as described above, and the photosensor 420 is integrated with the amorphous silicon (α-Si) thin-film transistor of the pixel 430 (including thin-film transistor and pixel electrode), so as to fabricate the ambient light sensor (ALS) and save the costs as well. The photosensor described above can be applied not only in the ambient light sensor but also in other photo sense devices.

For the foregoing embodiments, the photosensor and the method for fabricating the same can be employed such that the photo current has a linear relationship with the photo intensity and the photosensor can generate corresponding photo current more precisely according to the light illumination when the photosensor operates. In addition, the photoelectric stability of the photosensor can thus be enhanced so that the photosensor still has a steady photoelectric efficiency under a long-time light illumination.

As is understood by a person skilled in the art, the foregoing embodiments of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structures.

What is claimed is:

1. A photosensor, comprising:
a metal conductive layer;
an interface dielectric layer formed on the metal conductive layer;
a silicon-rich dielectric layer formed on the interface dielectric layer; and
a transparent conductive layer formed on the silicon-rich dielectric layer.

2. The photosensor of claim 1, wherein the interface dielectric layer has a thickness of approximately 10 angstroms to approximately 300 angstroms.

3. The photosensor of claim 1, wherein a material of the interface dielectric layer is selected from the group consisting of oxide, nitride, oxynitride and a combination thereof.

4. The photosensor of claim 1, wherein a material of the silicon-rich dielectric layer is selected from the group consisting of silicon-rich silicon oxide, silicon-rich silicon nitride, silicon-rich silicon oxynitride, silicon-rich silicon carbide, silicon-rich silicon oxycarbide and a combination thereof.

5. The photosensor of claim 1, wherein the silicon-rich dielectric layer comprises a hydrogenated silicon-rich dielectric layer.

6. Original) The photosensor of claim 5, wherein a material of the hydrogenated silicon-rich dielectric layer is selected from the group consisting of hydrogenated silicon-rich silicon oxide, hydrogenated silicon-rich silicon nitride, hydrogenated silicon-rich silicon oxynitride, hydrogenated silicon-rich silicon oxycarbide and a combination thereof.

7. The photosensor of claim 1, wherein a material of the transparent conductive layer comprises indium tin oxide, indium zinc oxide or aluminum zinc oxide.

8. The photosensor of claim 1, wherein the metal conductive layer
comprises a titanium/aluminum/titanium layer.

9. The photosensor of claim 8, wherein a material of the interface dielectric layer is selected from the group consisting of titanium oxide, titanium nitride, titanium oxynitride and a combination thereof.

10. The photosensor of claim 9, wherein the interface dielectric layer is formed by performing a plasma surface treatment to the metal conductive layer.

11. A photosensor, comprising:
a titanium/aluminum/titanium layer;
an interface oxide layer formed on the titanium/aluminum/titanium layer;
a silicon-rich dielectric layer formed on the interface oxide layer; and
a transparent conductive layer formed on the silicon-rich dielectric layer.

12. The photosensor of claim 11, wherein the interface oxide layer has a thickness of approximately 10 angstroms to approximately 300 angstroms.

13. The photosensor of claim 11, wherein the interface oxide layer comprises a titanium oxide layer.

14. The photosensor of claim 13, wherein the titanium oxide layer is formed by performing a plasma surface treatment to the titanium/aluminum/titanium layer.

15. A photosensor, comprising:
a conductive layer;
an interface dielectric layer formed on the conductive layer;
a silicon-rich dielectric layer formed on the interface dielectric layer; and
a transparent conductive layer formed on the silicon-rich dielectric layer.

16. A method for fabricating a photosensor, comprising:
forming a metal conductive layer;
forming an interface dielectric layer on the metal conductive layer;
forming a silicon-rich dielectric layer on the interface dielectric layer; and
forming a transparent conductive layer on the silicon-rich dielectric layer.

17. The method of claim 16, wherein the formed interface dielectric layer has thickness of approximately 10 angstroms to approximately 300 angstroms.

18. The method of claim 16, wherein a material of the interface dielectric layer is selected from the group consisting of oxide, nitride, oxynitride and a combination thereof.

19. The method of claim 16, wherein a material of the silicon-rich dielectric layer is selected from the group consisting of silicon-rich silicon oxide, silicon-rich silicon nitride, silicon-rich silicon oxynitride, silicon-rich silicon carbide, silicon-rich silicon oxycarbide and a combination thereof.

20. The method of claim 16, wherein the silicon-rich dielectric layer comprises a hydrogenated silicon-rich dielectric layer.

21. The method of claim 20, wherein a material of the hydrogenated silicon-rich dielectric layer is selected from the group consisting of hydrogenated silicon-rich silicon oxide, hydrogenated silicon-rich silicon nitride, hydrogenated silicon-rich silicon oxynitride, hydrogenated silicon-rich silicon oxycarbide and a combination thereof.

22. The method of claim 16, wherein a material of the transparent conductive layer comprises indium tin oxide, indium zinc oxide or aluminum zinc oxide.

23. The method of claim 16, wherein the metal conductive layer comprises a titanium/aluminum/titanium layer.

24. The method of claim 16, wherein the step of forming the interface dielectric layer comprises:
performing a plasma surface treatment to utilize a plasma gas reacting with the surface of the metal conductive layer to form the interface dielectric layer.

25. The method of claim 24, wherein the plasma gas is selected from
the group consisting of oxygen, nitrogen, nitrous oxide and the combination thereof.

26. The method of claim 25, wherein a material of the interface dielectric layer comprises metal oxide, metal nitride or metal oxynitride formed by the reaction of the metal conductive layer and the plasma gas.

27. A method for fabricating a photosensor, comprising:
forming a titanium/aluminum/titanium layer;
forming an interface oxide layer on the titanium/aluminum/titanium layer;
forming a silicon-rich dielectric layer on the interface oxide layer; and
forming a transparent conductive layer on the silicon-rich dielectric layer.

28. The method of claim 27, wherein the interface oxide layer has a thickness of approximately 20 angstroms to approximately 200 angstroms.

29. The method of claim 27, wherein a material of the interface oxide layer comprises titanium oxide.

30. The method of claim 27, wherein the step of forming the interface oxide layer comprises:
performing a plasma surface treatment such that the surface of the titanium/aluminum/titanium layer is reacted to form the interface oxide layer.

* * * * *